(12) United States Patent
Tamada et al.

(10) Patent No.: US 9,196,604 B2
(45) Date of Patent: Nov. 24, 2015

(54) POWER SEMICONDUCTOR MODULE HAVING PATTERN LAMINATED REGION

(71) Applicant: Mitsubishi Electric Corporation, Chiyoda-ku (JP)

(72) Inventors: Yoshiko Tamada, Tokyo (JP); Seiji Oka, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/409,301

(22) PCT Filed: Jul. 17, 2013

(86) PCT No.: PCT/JP2013/069380
§ 371 (c)(1),
(2) Date: Dec. 18, 2014

(87) PCT Pub. No.: WO2014/014012
PCT Pub. Date: Jan. 23, 2014

(65) Prior Publication Data
US 2015/0115288 A1    Apr. 30, 2015

(30) Foreign Application Priority Data
Jul. 19, 2012    (JP) .................................. 2012-160113

(51) Int. Cl.
*H01L 29/15* (2006.01)
*H01L 25/07* (2006.01)
(Continued)

(52) U.S. Cl.
CPC ............ *H01L 25/072* (2013.01); *H01L 23/049* (2013.01); *H01L 23/145* (2013.01);
(Continued)

(58) Field of Classification Search
CPC ................. H01L 2924/00; H01L 2224/32225; H01L 2224/48227; H01L 2224/73265; H01L 2924/00014
USPC ........................................ 257/77, 76, E29.104
See application file for complete search history.

(56) References Cited

U.S. PATENT DOCUMENTS

| 2008/0237847 A1* | 10/2008 | Nakanishi et al. ............ 257/722 |
| 2013/0069210 A1* | 3/2013 | Lee et al. ....................... 257/666 |
| 2014/0138707 A1* | 5/2014 | Miki et al. ....................... 257/77 |

FOREIGN PATENT DOCUMENTS

| JP | 08-316357 | 11/1996 |
| JP | 10-135377 | 5/1998 |

(Continued)

OTHER PUBLICATIONS

International Search Report issued Oct. 13, 2013, in PCT/JP13/069380 filed Jul. 7, 2013.

*Primary Examiner* — Andy Huynh
(74) *Attorney, Agent, or Firm* — Oblon, McClelland, Maier & Neustadt, L.L.P.

(57) ABSTRACT

A power semiconductor module includes a base plate as a metallic heat dissipating body, a first insulating layer on the base plate, and a first wiring pattern on the first insulating layer. On a predetermined region that is a part of the first wiring pattern, a second wiring pattern for a second layer is laminated via only a second insulating layer made of resin, thereby forming a pattern laminated region. A power semiconductor element is mounted in a region other than the pattern laminated region on the first wiring pattern. The base plate, the first insulating layer, the first wiring pattern, the second insulating layer, the second wiring pattern, and the power semiconductor element are integrally sealed with a transfer mold resin, thus obtaining the power semiconductor module.

9 Claims, 8 Drawing Sheets

(51) Int. Cl.
- *H01L 23/049* (2006.01)
- *H01L 23/24* (2006.01)
- *H01L 23/373* (2006.01)
- *H01L 23/433* (2006.01)
- *H01L 23/498* (2006.01)
- *H01L 23/31* (2006.01)
- *H01L 25/18* (2006.01)
- *H01L 23/14* (2006.01)
- *H01L 23/15* (2006.01)
- *H01L 23/367* (2006.01)
- *H01L 23/00* (2006.01)
- *H05K 1/05* (2006.01)
- *H05K 3/28* (2006.01)

(52) U.S. Cl.
CPC ............... *H01L 23/15* (2013.01); *H01L 23/24* (2013.01); *H01L 23/3107* (2013.01); *H01L 23/3675* (2013.01); *H01L 23/3735* (2013.01); *H01L 23/3736* (2013.01); *H01L 23/4334* (2013.01); *H01L 23/49811* (2013.01); *H01L 24/49* (2013.01); *H01L 25/18* (2013.01); *H05K 1/05* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/04042* (2013.01); *H01L 2224/291* (2013.01); *H01L 2224/32225* (2013.01); *H01L 2224/45015* (2013.01); *H01L 2224/45124* (2013.01); *H01L 2224/45147* (2013.01); *H01L 2224/48091* (2013.01); *H01L 2224/48137* (2013.01); *H01L 2224/48139* (2013.01); *H01L 2224/48227* (2013.01); *H01L 2224/4911* (2013.01); *H01L 2224/49175* (2013.01); *H01L 2224/73265* (2013.01); *H01L 2924/1033* (2013.01); *H01L 2924/10253* (2013.01); *H01L 2924/10254* (2013.01); *H01L 2924/10272* (2013.01); *H01L 2924/1203* (2013.01); *H01L 2924/1305* (2013.01); *H01L 2924/13055* (2013.01); *H01L 2924/13091* (2013.01); *H01L 2924/15787* (2013.01); *H01L 2924/1815* (2013.01); *H01L 2924/3011* (2013.01); *H01L 2924/30107* (2013.01); *H05K 1/053* (2013.01); *H05K 3/284* (2013.01); *H05K 2203/1316* (2013.01)

(56) References Cited

FOREIGN PATENT DOCUMENTS

| | | |
|---|---|---|
| JP | 2006-319095 | 11/2006 |
| JP | 4430497 | 3/2010 |
| JP | 2011-199275 | 10/2011 |
| JP | 2013-051401 | 3/2013 |

* cited by examiner

POWER SEMICONDUCTOR MODULE HAVING PATTERN LAMINATED REGION

TECHNICAL FIELD

The present invention relates to a power semiconductor module of insulation type, used in a power conversion device such as an inverter.

BACKGROUND ART

Recently, size reduction of a power conversion device is required, so it is important to reduce the size of a power semiconductor module used therein.

As a general structure of a power semiconductor module, a wiring pattern is formed via an insulating layer on a metal plate serving as a heat dissipating plate, a power semiconductor element is provided thereon and connected with each terminal by a wire bond, and then these are sealed with resin.

Such power semiconductor modules can be roughly classified into two types, i.e., a case-type module which is sealed with silicone gel and a transfer-mold-type module which is sealed with epoxy resin (for example, see Patent Document 1 for the former one and Patent Document 2 for the latter one). The former case-type module often uses a ceramic insulating layer as the insulating layer, and the latter transfer-mold-type module often uses a resin insulating layer.

In a power semiconductor module that performs switching operation with large current and high voltage, a temporal change rate di/dt of current when a power semiconductor element is turned off and a wiring inductance L contained in a power conversion device cause surge voltage $\Delta V = L \cdot di/dt$ to be applied to the power semiconductor element. If the wiring inductance L is great, surge voltage that exceeds withstand voltage of the power semiconductor element occurs, which may cause deterioration in the power semiconductor element.

Therefore, for a power semiconductor module, size reduction is required, and also reduction of inductance is important.

For example, in a conventional semiconductor module, a semiconductor element as an electronic component is mounted on a ceramic circuit board including a ceramic multilayer board formed by three or more laminated ceramic boards bonded with each other, surface-layer metallic circuit boards bonded on the upper surface and the lower surface of the ceramic multilayer board, an inside-layer metallic circuit board placed in a circuit through hole formed in inside-layer ceramic boards, and a metallic pole having one end connected to an inside-layer metallic circuit board and the other end connected to another inside-layer metallic circuit board or a surface-layer metallic circuit board with a brazing material so that the inside-layer metallic circuit board is connected with the other inside-layer metallic circuit board or the surface-layer metallic circuit board (for example, see Patent Document 3).

In addition, for example, in a conventional semiconductor module, a bus bar inside the module is formed in a lamination structure so as to reduce an inductance at the bus bar portion, thereby realizing inductance reduction of the semiconductor module (for example, see Patent Document 4).

CITATION LIST

Patent Document

Patent Document 1: Japanese Laid-Open Patent Publication No. 08-316357
Patent Document 2: Japanese Laid-Open Patent Publication No. 10-135377
Patent Document 3: Japanese Laid-Open Patent Publication No. 2011-199275
Patent Document 4: Japanese Patent No. 4430497

SUMMARY OF THE INVENTION

Problems to be Solved by the Invention

In the above conventional semiconductor module described in Patent Document 3, since a ceramic multilayer board is used, it is considered that the size of the semiconductor module can be reduced and an effect of reducing an inductance at the part where circuits overlap is also obtained. However, the ceramic multilayer board has a large thermal resistance due to its multilayer structure, so that there is a problem that heat generated when, for example, the power semiconductor element mounted on the ceramic multilayer board performs switching cannot be efficiently dissipated. In addition, the method in which a metallic pole is used for connection between the multilayer metallic circuit boards and is used as a current path is not suitable for a power module with a large current capacitance.

In the above conventional semiconductor module described in Patent Document 4, although an inductance can be reduced at the part where the bus bar is laminated, there is no explanation about the shape of an output terminal of the bus bar or connection between the bus bar and the semiconductor element, and it is estimated that the shape of the output terminal and the configuration of connection with the power semiconductor element are complex. In addition, it is estimated that a manufacturing process is complicated due to a process such as performing insert molding with a case while sandwiching an insulating paper between the bus bars. In addition, resin fluidity of the case is low and it is necessary to expand the distance between the bus bars, so that the effect of reducing an inductance may be decreased.

The present invention has been made to solve the above problems, and an object of the present invention is to obtain a power semiconductor module that realizes size reduction and inductance reduction with a simple configuration and suppresses increase in thermal resistance.

Means of Solution to the Problems

A power semiconductor module according to the present invention is a power semiconductor module of insulation type, which contains a plurality of power semiconductor elements therein, the power semiconductor module includes a base plate as a metallic heat dissipating body, a first insulating layer provided on the base plate, and a first wiring pattern provided on the first insulating layer. And a predetermined region on the first wiring pattern is a pattern laminated region in which a second wiring pattern for a second layer is laminated via only a second insulating layer made of resin.

Effect of the Invention

A power semiconductor module according to the present invention is a power semiconductor module of insulation type, which contains a plurality of power semiconductor elements therein, the power semiconductor module includes a base plate as a metallic heat dissipating body, a first insulating layer provided on the base plate, and a first wiring pattern provided on the first insulating layer. And a predetermined region on the first wiring pattern is a pattern laminated region in which a second wiring pattern for a second layer is laminated via only a second insulating layer made of resin. Therefore, wirings in the power semiconductor module can be laminated in the pattern laminated region, whereby size reduction and inductance reduction in the power semiconductor module can be realized with a simple configuration. In addition, a power semiconductor element can be placed in a region other than the pattern laminated region on the first wiring pattern, whereby heat generated by the power semiconductor element can be efficiently dissipated.

EMBODIMENTS FOR CARRYING OUT THE INVENTION

Embodiment 1

Figure 1:
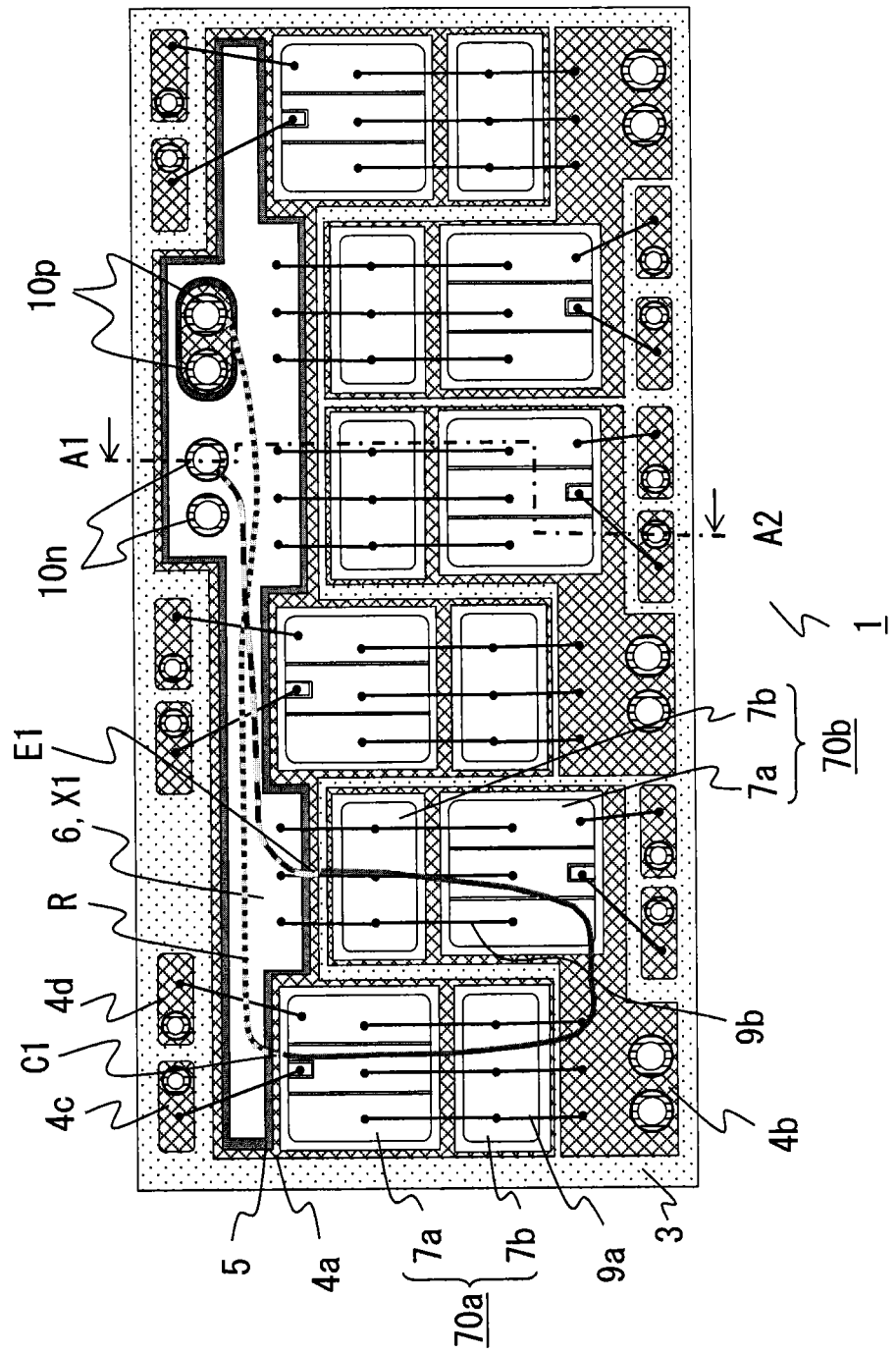
FIG. 1 is a plan view schematically showing the configuration of a power semiconductor module in embodiment 1 of the present invention.
Figure 2:
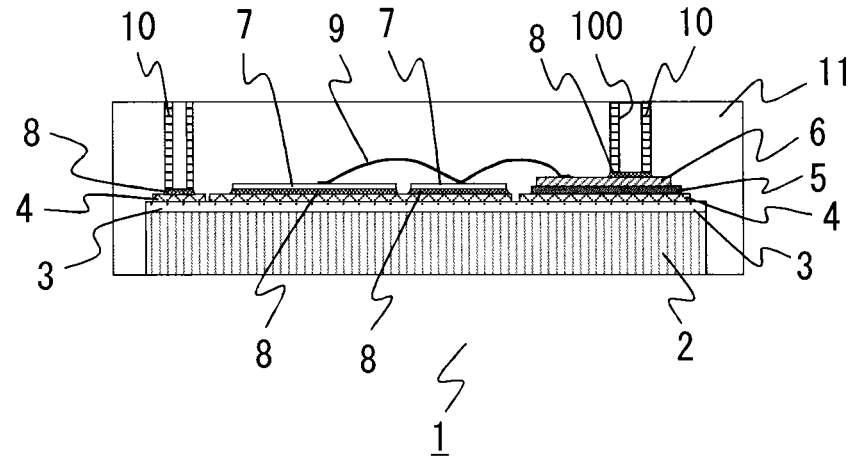
FIG. 2 is an A1-A2 sectional view of the plan view in FIG. 1.

FIG. 1 is a plan view schematically showing the configuration of a power semiconductor module 1 in embodiment 1 of the present invention. FIG. 2 is an A1-A2 sectional view of the plan view in FIG. 1. The present embodiment 1 adopts a power semiconductor module having a so-called 6-in-1 structure and applicable to three-phase AC, as an example. The power semiconductor module with a 6-in-1 structure includes circuits for three phases in each of which two pairs of a self-arc-extinguishing type semiconductor element and a circulation diode connected in antiparallel are connected in series.

First, with reference to FIG. 1 and FIG. 2, the configuration of the power semiconductor module 1 will be briefly described. For making it easy to grasp the internal configuration of the power semiconductor module 1, a transfer mold resin is not shown in the plan view in FIG. 1.

The power semiconductor module 1 is a power semiconductor module of insulation type containing a plurality of power semiconductor elements 7 therein, and includes a base plate 2 which is a metallic heat dissipating body for dissipating heat generated in the power semiconductor module 1 to outside, a first insulating layer 3 provided on the base plate 2, and a first wiring pattern 4 for the first layer, which is provided on the first insulating layer 3 and formed by a metal foil. On a predetermined region that is a part of the first wiring pattern 4, a second wiring pattern 6 for the second layer, which is formed by a metal foil, is laminated via a second insulating layer 5. Thus, a pattern laminated region X1 is formed in which two layers of the first and second wiring patterns 4 and 6 are laminated.

On the first wiring pattern 4, in a region different from the pattern laminated region X1, the plurality of power semiconductor elements 7 are mounted and bonded with the first wiring pattern 4 by solder 8. In addition, electric connection is made as necessary by a wire bond 9 between the power semiconductor elements 7, between each power semiconductor element 7 and the first and second wiring patterns 4 and 6, etc. At each necessary portion on the first and second wiring patterns 4 and 6, a terminal 10 of socket type for external connection is provided. The terminals 10 are connected with the first and second wiring patterns 4 and 6 by solder 8. A rod-like external terminal (not shown) is inserted and connected into a hole portion 100 of each terminal 10.

These members (the base plate 2, the first insulating layer 3, the first wiring pattern 4, the second insulating layer 5, the second wiring pattern 6, the power semiconductor element 7, the wire bond 9, the terminal 10, and the like) are integrally sealed with a transfer mold resin 11, thereby forming the power semiconductor module 1.

In the present embodiment 1, a socket-type terminal into which an external terminal is inserted and connected is employed as the terminal 10. However, any terminal that allows connection with an external circuit, such as a terminal of screw-connection type, may be used.

Next, a material and the like of each member will be described.

For the base plate 2, a metal with an excellent thermal conductivity, e.g., aluminum, aluminum alloy, copper, copper alloy, iron, or iron alloy, or a composite material such as copper/iron-nickel alloy/copper or aluminum/iron-nickel alloy/aluminum, may be used. Particularly, in the case where a current capacity of the power semiconductor element is large, copper which is also excellent in electric conductivity is preferably used. In addition, the thickness, the length, and the width of the base plate 2 are determined as appropriate depending on the current capacity of the power semiconductor element 7, for example. It is preferable that, the larger the current capacity of the power semiconductor element 7 is, the larger the thickness, the length, and the width of the base plate 2 are set to be.

In the present embodiment 1, an aluminum plate with a thickness of 3 mm is used as the base plate 2.

For the first insulating layer 3, for example, various types of ceramics, a resin insulating sheet containing inorganic powder, a resin insulating sheet containing a glass fiber, or the like may be used.

For the second insulating layer 5, a resin material is used, for example, a resin insulating sheet containing inorganic powder, a resin insulating sheet containing a glass fiber, or the like may be used.

In the present embodiment 1, both of the first and second insulating layers 3 and 5 are formed by an epoxy resin insulating sheet containing alumina powder as inorganic powder. Other examples of such inorganic powder include beryllia, boron nitride, magnesia, silica, silicon nitride, aluminum nitride, and the like. The thicknesses of the first and second insulating layers 3 and 5 formed by a resin insulating sheet are set at about 20 to 400 μm, for example.

For the metal foils forming the first wiring pattern 4 and the second wiring pattern 6, for example, a copper foil is used, and the thickness of the copper foil is set at 0.3 mm.

In addition, for the wire bond 9, an aluminum wire, a copper wire, or the like may be used. Here, an aluminum wire is used as the wire bond 9.

It is noted that the thickness of the copper foils forming the first and second wiring patterns 4 and 6, and the diameter and the number of metal wires used for the wire bond 9 are determined as appropriate depending on the current capacity of the power semiconductor element 7, and are not limited to the example shown in the present embodiment 1.

Next, an example of a manufacturing method for the power semiconductor module 1 will be described.

First, on the base plate 2 made of an aluminum plate with a thickness of 3 mm, an epoxy resin sheet containing alumina powder in a B-stage state is placed as the first insulating layer 3, and then a copper foil (for first layer) with a thickness of 0.3 mm is overlaid thereon. It is noted that the B-stage state refers to a hardening intermediate state of a thermosetting resin such as an epoxy resin. Then, the base plate 2, the first insulating layer 3, and the copper foil (for first layer) that are overlaid are heated and pressurized, and the base plate 2 and the copper foil (for first layer) are adhered by hardening of the first insulating layer 3. Thereafter, the copper foil (for first layer) is etched into a predetermined shape, thereby forming the first wiring pattern 4 for the first layer. On the first wiring pattern 4, an element-mounting portion for mounting each power semiconductor element 7 is formed at a predetermined position.

Next, on a predetermined region that is a part of the first wiring pattern 4 for the first layer, an epoxy resin sheet containing alumina powder in a B-stage state is placed as the second insulating layer 5, and then a copper foil (for second layer) with a thickness of 0.3 mm which has substantially the same size as the second insulating layer 5 is overlaid thereon. Then, these are heated and pressurized again, and the first wiring pattern 4 and the copper foil (for second layer) are adhered by hardening of the second insulating layer 5. Thereafter, the copper foil (for second layer) is etched into a predetermined shape, thereby forming the second wiring pattern 6 for the second layer.

Thus, a metallic circuit board is formed by the base plate 2, the first insulating layer 3, the first wiring pattern 4, the second insulating layer 5, and the second wiring pattern 6 that are laminated. In the present embodiment 1, since the first insulating layer 3 and the second insulating layer 5 are formed by epoxy resin insulating sheets, they also serve as an adhesive agent for adhering each member while insulating each member, by being placed between the base plate 2 and the first wiring pattern 4 and between the first wiring pattern 4 and the second wiring pattern 6.

After the metallic circuit board is formed, a solder resist (not shown) which is an insulating film for protecting the first wiring pattern 4 and the second wiring pattern 6 may be formed at any position on a surface of the metallic circuit board.

Next, by using solder 8, the power semiconductor elements 7 are bonded in element mounting portions provided at predetermined positions on the first wiring pattern 4 for the first layer, and the terminals 10 for external connection are bonded at any positions on the first wiring pattern 4 and the second wiring pattern 6. It is noted that the power semiconductor elements 7 are placed only on the first wiring pattern 4 but are not placed on the second wiring pattern 6.

Then, between the first wiring pattern 4 or the second wiring pattern 6 and each power semiconductor element 7, and between the power semiconductor elements 7, connection is made by wire bonds 9 at portions where electric conduction is needed. In the present embodiment 1, connection between the first and second wiring patterns 4 and 6 and each power semiconductor element 7, and connection between the power semiconductor elements 7 are made by wire bonds 9, but connection are not limited thereto. Any method may be used as long as electric connection can be made.

Next, the metallic circuit board on which the power semiconductor elements 7, the terminals 10, and the like are mounted is set in a mold, and then, for example, the epoxy-resin-based transfer mold resin 11 filled with silica powder is injected into the mold, whereby the metallic circuit board on which the power semiconductor elements 7, the terminals 10, and the like are mounted is sealed.

In the present embodiment 1, an epoxy resin sheet containing alumina powder is used as the second insulating layer 5 which is an insulating layer for the second layer. Instead, a film or a sheet of an insulating resin such as polyimide may be used. In addition, besides a process by heating and pressurizing, the first wiring pattern 4 and the second wiring pattern 6 may be bonded by using a polyimide sheet having a gluing agent applied on both surfaces thereof.

Generally, an insulating board is formed by placing only one layer of wiring pattern on a metallic base plate via an insulating layer, and such an insulating board is commercially available. For example, the power semiconductor module 1 of the present embodiment 1 may be formed by using such a commercially available insulating board. That is, a wiring pattern of the general insulting board may be used as the wiring pattern for the first layer, and then in a partial region on this wiring pattern, the wiring pattern for the second layer may be provided via an insulating layer.

Next, placement of the power semiconductor elements 7 in the power semiconductor module 1 of embodiment 1, and the connection relationship thereamong will be described in detail.

As described above, in the present embodiment 1, the power semiconductor module 1 having a 6-in-1 structure is adopted, and the power semiconductor module 1 includes circuits for three phases. In each phase, two pairs of circuit in which a self-arc-extinguishing type semiconductor element 7a as the power semiconductor element 7 and a circulation diode 7b as the power semiconductor element 7 that are connected in antiparallel are connected in series.

In the power semiconductor module 1 of the present embodiment 1, for example, the self-arc-extinguishing type semiconductor element 7a and the circulation diode 7b placed at the leftmost in FIG. 1 form a positive-side arm 70a, and the self-arc-extinguishing type semiconductor element 7a and the circulation diode 7b placed adjacent thereto form a negative-side arm 70b. Then, the positive-side arm 70a and the negative-side arm 70b form each circuit for one phase.

As the self-arc-extinguishing type semiconductor element 7a, typically, an IGBT (Insulated Gate Bipolar Transistor) or a MOSFET (Metal Oxide Semiconductor Field Effect Transistor) is used. However, the self-arc-extinguishing type semiconductor element 7a is not limited thereto, and another type of self-arc-extinguishing type semiconductor element may be used. In the present embodiment 1, an IGBT is applied as the self-arc-extinguishing type semiconductor element 7a, and the self-arc-extinguishing type semiconductor element 7a has a gate electrode as a control electrode, a collector electrode as an input electrode, and an emitter electrode as an output electrode. In the case of applying an MOSFET, generally, a drain electrode corresponds to an input electrode, and a source electrode corresponds to an output electrode.

Figure 3:
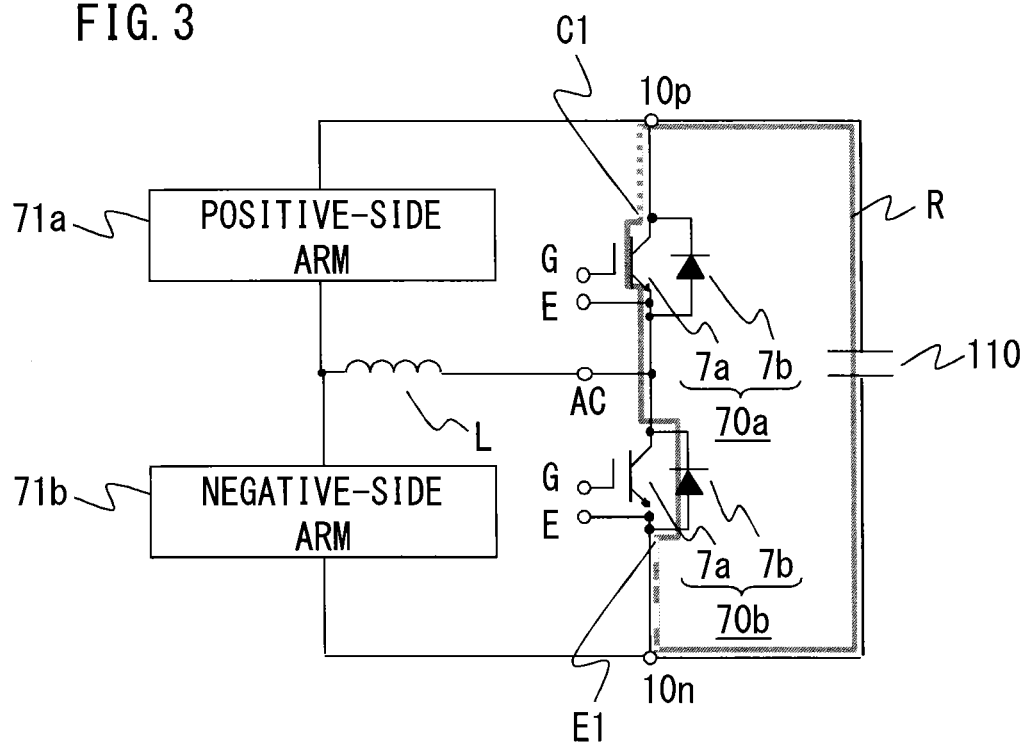
FIG. 3 is a circuit diagram for explaining the circuit configuration of the power semiconductor module in embodiment 1 of the present invention.

Here, FIG. 3 shows an equivalent circuit diagram including an external circuit in the case where the circuit for one phase of the three phases in the power semiconductor module 1 forms a two-level power conversion circuit. As shown in FIG. 3, in this circuit, two pairs of the self-arc-extinguishing type semiconductor element 7a and the circulation diode 7b connected in antiparallel are connected in series, and this series unit is connected to a positive terminal 10p and a negative terminal 10n which are both ends of a capacitor 110. An arm connected to the positive terminal of the capacitor 110 is the positive-side arm 70a, and an arm connected to the negative terminal of the capacitor 110 is the negative-side arm 70b. It is noted that a midpoint AC between the positive-side arm 70a and the negative-side arm 70b is connected via a load L to a midpoint between a positive-side arm 71a and a negative-side arm 71b for another phase.

Regarding the circuit for one phase composed of the positive-side arm 70a at the leftmost and the adjacent negative-side arm 70b in FIG. 1, the connection relationship thereof will be described with reference to FIG. 3.

First, in FIG. 3, a connection path between the positive terminal 10p and a point C1 on the collector electrode side of the positive-side arm 70a is indicated by a dotted line, and in FIG. 1, the connection path is indicated by a dotted line between the point C1 and 10P. As shown in FIG. 1, in a first region 4a on the first wiring pattern 4, the positive terminal 10p and the positive-side arm 70a are provided, so that the connection path between the positive terminal 10p and the positive-side arm 70a is present on the first wiring pattern 4 for the first layer.

Next, in FIG. 3, a connection path between a point E1 on the emitter electrode side of the negative-side arm 70b and the negative terminal 10n is indicated by a dotted-dashed line, and in FIG. 1, the path is indicated by a dotted-dashed line between the point E1 and 10n. As shown in FIG. 1, in a second region 4b on the first wiring pattern 4, the negative-side arm 70b is provided, and the negative-side arm 70b is connected to the second wiring pattern 6 for the second layer by a wire bond 9b (9). Since the negative terminal 10n is provided on the second wiring pattern 6 for the second layer, the connection path between the negative-side arm 70b and the negative terminal 10n is mainly present on the second wiring pattern 6 for the second layer.

It is noted that connection between the positive-side arm 70a and the negative-side arm 70b is made via a wire bond 9a (9) and the second region 4b of the first wiring pattern 4.

In addition, wiring for the gate electrode of the self-arc-extinguishing type semiconductor element 7a composing the positive-side arm 70a is formed in a third region 4c which is a part of the first wiring pattern 4 for the first layer, and wiring for control of the emitter electrode is formed in a fourth region 4d which is adjacent to the third region 4c and is a part of the first wiring pattern 4.

As described above, electric connection between the positive terminal 10p and the positive-side arm 70a is made via the first wiring pattern 4 for the first layer, and electric connection between the negative-side arm 70b and the negative terminal 10n is made via the second wiring pattern 6 for the second layer which is overlaid on the upper side of the first wiring pattern 4.

Thus, since the first wiring pattern 4 and the second wiring pattern 6 are formed in a laminated manner, the current path connecting the positive terminal 10p and the positive-side arm 70a and the current path connecting the negative-side arm 70b and the negative terminal 10n in a main circuit can be formed in a parallel and flat plate shape. Therefore, the current paths in the circuit can be shortened and a wiring inductance inside the power semiconductor module 1 can be reduced.

As also described above, in a power semiconductor module that performs switching operation with large current and high voltage, a temporal change di/dt of current when a self-turn-off semiconductor element which is a power semiconductor element is turned off and a wiring inductance L cause surge voltage $\Delta V = L \cdot di/dt$ to be applied to the self-arc-extinguishing type semiconductor element. If the wiring inductance L is great, surge voltage that exceeds withstand voltage of the self-arc-extinguishing type semiconductor element occurs, which may cause deterioration in the self-arc-extinguishing type semiconductor element. Therefore, suppressing the surge voltage leads to efficient exertion of the function of the self-arc-extinguishing type semiconductor element. In order to suppress the surge voltage, it is required to reduce the wiring inductance L in a commutation loop which is a path on which the surge voltage occurs, that is, a path on which the temporal change di/dt of current occurs when switching operation is performed.

A commutation loop R in the circuit shown in FIG. 3 is indicated by a gray solid line (partially including a dotted line and a dotted-dashed line). In addition, in association with FIG. 3, similarly, in FIG. 1, the commutation loop R is also indicated by a gray solid line (partially including a dotted line and a dotted-dashed line) on the circuit for one phase composed of the positive-side arm 70a at the leftmost and the adjacent negative-side arm 70b.

The above-described path (dotted-line part) from the positive terminal 10p to the positive-side arm 70a and the above-described path (dotted-dashed-line part) from the negative-side arm 70b to the negative terminal 10n are included in the commutation loop, and are a main part of the commutation loop. As described above, the path from the positive terminal 10p to the positive-side arm 70a passes through the first region 4a of the first wiring pattern 4, and the path from the negative-side arm 70b to the negative terminal 10n passes through the second wiring pattern 6 which is overlaid on the first region 4a part of the first wiring pattern 4. In the commutation loop at the overlaid part, the directions of currents are opposite to each other, whereby magnetic fluxes generated due to the temporal changes di/dt of the currents cancel each other. That is, owing to the cancelling of magnetic fluxes due to di/dt in addition to the shortening of the path by lamination of the first region 4a part of the first wiring pattern 4 and the second wiring pattern 6, the wiring inductance L in the commutation loop can be efficiently reduced.

In the above, it is described that the second insulating layer 5 and the second wiring pattern 6 are placed at any positions other than the element mounting portions on the first wiring pattern 4. The placement of the second wiring pattern 6 is determined so as to be located at any position other than the element mounting portions on the first wiring pattern 4. And as described above, the second wiring pattern 6 is located in a place in which wirings in the commutation loop are laminated and the directions of the currents are opposite to each other.

The power semiconductor elements 7 such as the self-arc-extinguishing type semiconductor element 7a and the circulation diode 7b are placed only on the first wiring pattern 4 but are not placed on the second wiring pattern 6. An effect owing to this will be described.

In the power semiconductor element 7, since heat is generated in switching or the like, it is necessary to efficiently dissipate the generated heat. Generally, a power semiconductor module is used being connected to a heat radiator, and reduction of thermal resistance of members laminated between the power semiconductor element and a base plate which contacts the heat radiator leads to increase in heat dissipation efficiency. Particularly, an insulating body having a low thermal conductivity as compared to a conductor increases the thermal resistance. Therefore, it can be said that reduction of the thermal resistance due to the insulating body increases the heat dissipation efficiency. In the pattern laminated region X1 in which the second wiring pattern 6 is provided, since insulating layers which are insulating bodies are laminated in two layers, the thermal resistance is large. On the other hand, in a part other than the pattern laminated region, a single insulating layer is provided and the lower part of the first wiring pattern 4 is directly adhered to the base plate 2 via the first insulating layer 3. Therefore, the power semiconductor elements 7 are placed on the first wiring pattern 4, whereby heat generated by the power semiconductor elements 7 is efficiently transferred to the base plate 2 and dissipated.

As described above, the power semiconductor module 1 of the present embodiment 1 includes the pattern laminated region X1 in which the second wiring pattern 6 for the second layer is laminated in a partial region on the first wiring pattern 4 for the first layer via only the second insulating layer 5. Therefore, the wiring from the positive terminal 10p to the positive-side arm 70a and the wiring from the negative-side arm 70b to the negative terminal 10n, which form a main circuit of the power semiconductor module 1, can be respectively provided on the first wiring pattern 4 for the first layer and the second wiring pattern 6 for the second layer, whereby the current path can be formed in a parallel and flat plate shape. Therefore, the current paths in the circuit can be shortened and a wiring inductance inside the power semiconductor module 1 can be reduced.

Further, in the commutation loop at the part where the first and second wiring patterns 4 and 6 are laminated, the directions of currents are opposite to each other and therefore magnetic fluxes generated due to the temporal changes di/dt of the currents can be cancelled by each other, whereby a wiring inductance in the commutation loop can be efficiently reduced.

In addition, since the first and second wiring patterns 4 and 6 are laminated, a space needed for wiring can be reduced, so that the size of the power semiconductor module 1 can be reduced.

In addition, since the power semiconductor elements 7, which are heat sources, are placed on the first wiring pattern 4 for the first layer, heat generated by the power semiconductor element 7 can be efficiently transferred to the base plate 2, and thus the power semiconductor module 1 with high cooling performance can be obtained.

In the present embodiment 1, the power semiconductor module 1 having a 6-in-1 structure is adopted as an example, but the power semiconductor module is not limited thereto. The present embodiment 1 can be also applied to a power semiconductor module having a so-called 2-in-1 structure or a so-called 1-in-1 structure, whereby the same effect can be obtained.

On the other hand, in the 6-in-1 structure described in the present embodiment 1, since the first and second wiring patterns 4 and 6 are laminated and the wiring inductance can be efficiently reduced, particularly, inductance variation among the phases on the negative side is small. Therefore, when the present invention is applied to the 6-in-1 structure, an effect of reducing switching speed variation or surge voltage variation among the phases can be obtained.

Embodiment 2

Figure 4:
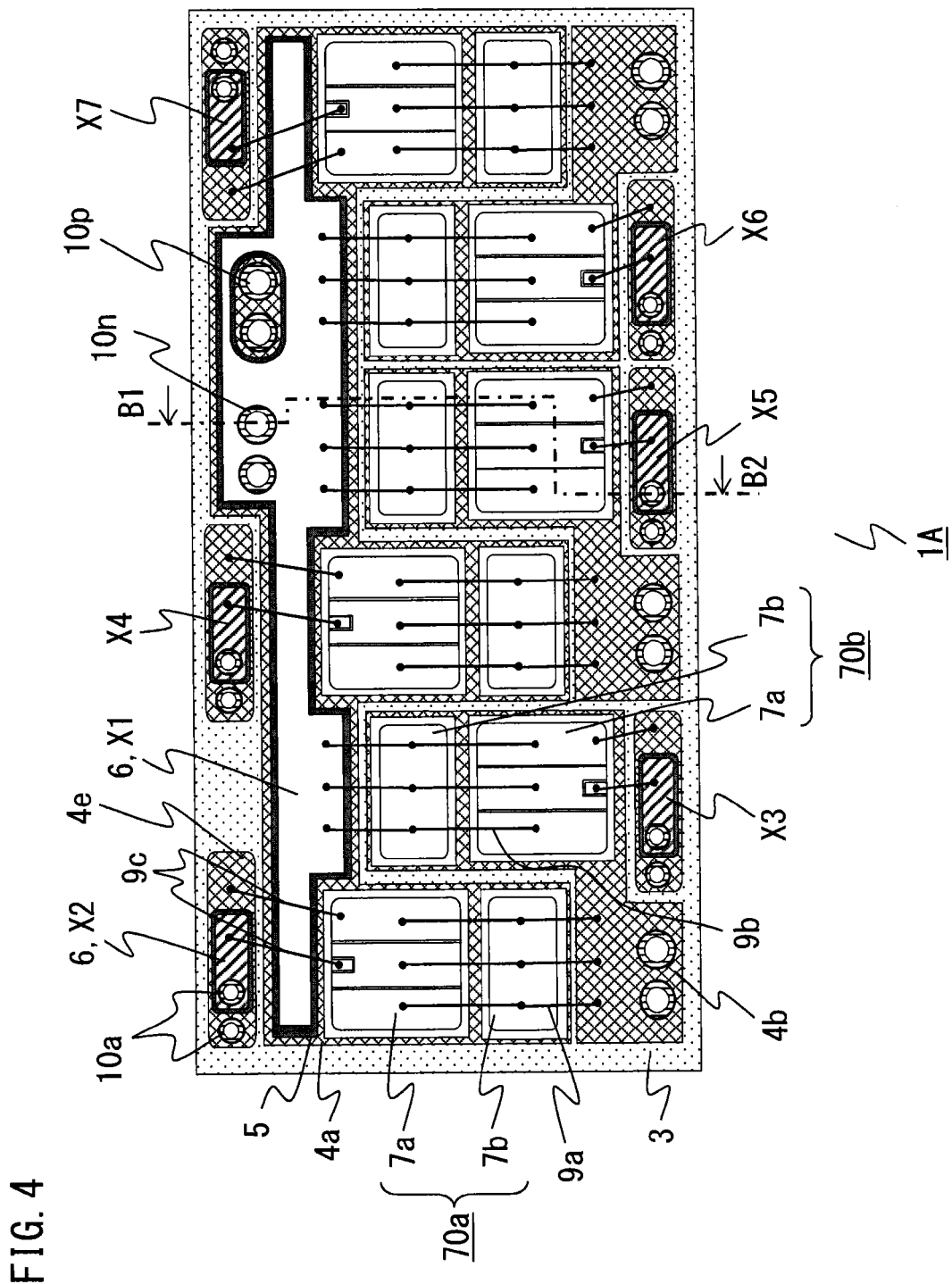
FIG. 4 is a plan view schematically showing the configuration of a power semiconductor module in embodiment 2 of the present invention.
Figure 5:
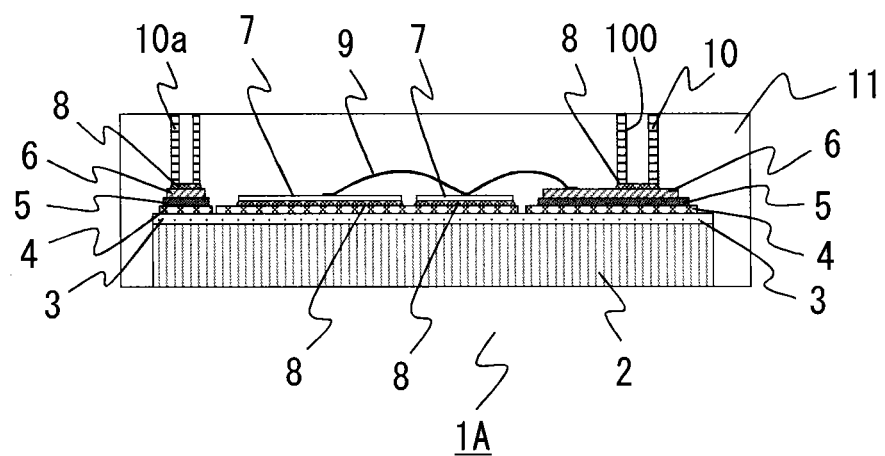
FIG. 5 is a B1-B2 sectional view of the plan view in FIG. 4.

FIG. 4 is a plan view schematically showing the configuration of a power semiconductor module 1A in embodiment 2 of the present invention. FIG. 5 is a B1-B2 sectional view of the plan view in FIG. 4. For making it easy to grasp the internal configuration of the power semiconductor module 1A, the transfer mold resin 11 is not shown in the plan view in FIG. 4.

Also in the present embodiment 2, as in the above embodiment 1, a power semiconductor module having a 6-in-1 structure is adopted, and the power semiconductor module includes circuits for three phases in each of which two pairs of the self-arc-extinguishing type semiconductor element 7a and the circulation diode 7b connected in antiparallel are connected in series. A basic configuration such as placement of the power semiconductor elements 7a and 7b is almost the same as in the above embodiment 1, but the locations where a pattern of wiring for the gate electrode and a pattern of wiring for control of the emitter electrode of each self-arc-extinguishing type semiconductor element 7a are provided are different from those in the above embodiment 1. It is noted that the same components as in the above embodiment 1 are denoted by the same reference characters, and the description thereof is omitted.

In the above embodiment 1, wiring for the gate electrode and wiring for control of the emitter electrode of each self-arc-extinguishing type semiconductor element 7a are both formed in the first wiring pattern 4 (in the third region 4c and the fourth region 4d) for the first layer.

On the other hand, in the present embodiment 2, as shown in FIG. 4 and FIG. 5, pattern laminated regions where the first wiring pattern 4 for the first layer and the second wiring pattern 6 for the second layer are laminated are present at a plurality of locations. One of the wiring for the gate electrode and the wiring for control of the emitter electrode of each self-arc-extinguishing type semiconductor element 7a is formed in the first wiring pattern for the first layer, and the other one is formed in the second wiring pattern for the second layer. Thus, the wiring for the gate electrode and the wiring for control of the emitter electrode are laminated in the pattern laminated region.

Specifically, in the present embodiment 2, besides the pattern laminated region X1, there are six pattern laminated regions X2 to X7. For example, in FIGS. 4 and 5, the wiring for control of the emitter electrode of the self-arc-extinguishing type semiconductor element 7a placed at the leftmost is formed in the first wiring pattern 4 (in a fifth region 4e of the first wiring pattern 4) for the first layer, and the wiring for the gate electrode is formed in the second wiring pattern 6 for the second layer in the pattern laminated region X2 (the wiring pattern 6 for the second layer laminated on the fifth region 4e of the first wiring pattern 4 via the second insulating layer). Thus, the wiring for the gate electrode and the wiring for control of the emitter electrode of the self-arc-extinguishing type semiconductor element 7a are laminated. The first wiring pattern 4e (4) and the second wiring pattern 6 (X2) are respectively connected to the emitter electrode and the gate electrode of the self-arc-extinguishing type semiconductor element 7a by wire bonds 9 (wire bonds indicated by 9c in FIG. 4), and the emitter electrode and the gate electrode are connected to the respective terminals 10 for control (terminals indicated by 10a in FIG. 4 and FIG. 5). An external circuit is connected to each terminal 10a.

The five self-arc-extinguishing type semiconductor elements 7a other than the self-arc-extinguishing type semiconductor element 7a placed at the leftmost also have the same configuration such that wiring for the gate electrode and wiring for control of the emitter electrode are laminated in each of the pattern laminated regions X3 to X7.

As described above, in the present embodiment 2, the wiring for the gate electrode and the wiring for control of the emitter electrode of the self-arc-extinguishing type semiconductor element 7*a* are laminated, whereby the path between the gate electrode and the emitter electrode is shortened. Therefore, in addition to the effect of embodiment 1, impedance on the gate-emitter path can be reduced, and vibration and oscillation of the gate, and the like can be suppressed. In addition, since the wiring for the gate electrode and the wiring for control of the emitter electrode are laminated, the size of the power semiconductor module 1A can be further reduced.

In the present embodiment 2, the wiring for control of the emitter electrode is formed in the first wiring pattern 4 for the first layer, and the wiring for the gate electrode is formed in the second wiring pattern 6 for the second layer, but the configuration is not limited thereto. The wiring for the gate electrode may be formed in the first wiring pattern 4 for the first layer, and the wiring for control of the emitter electrode may be formed in the second wiring pattern 6 for the second layer.

Embodiment 3

Figure 6:
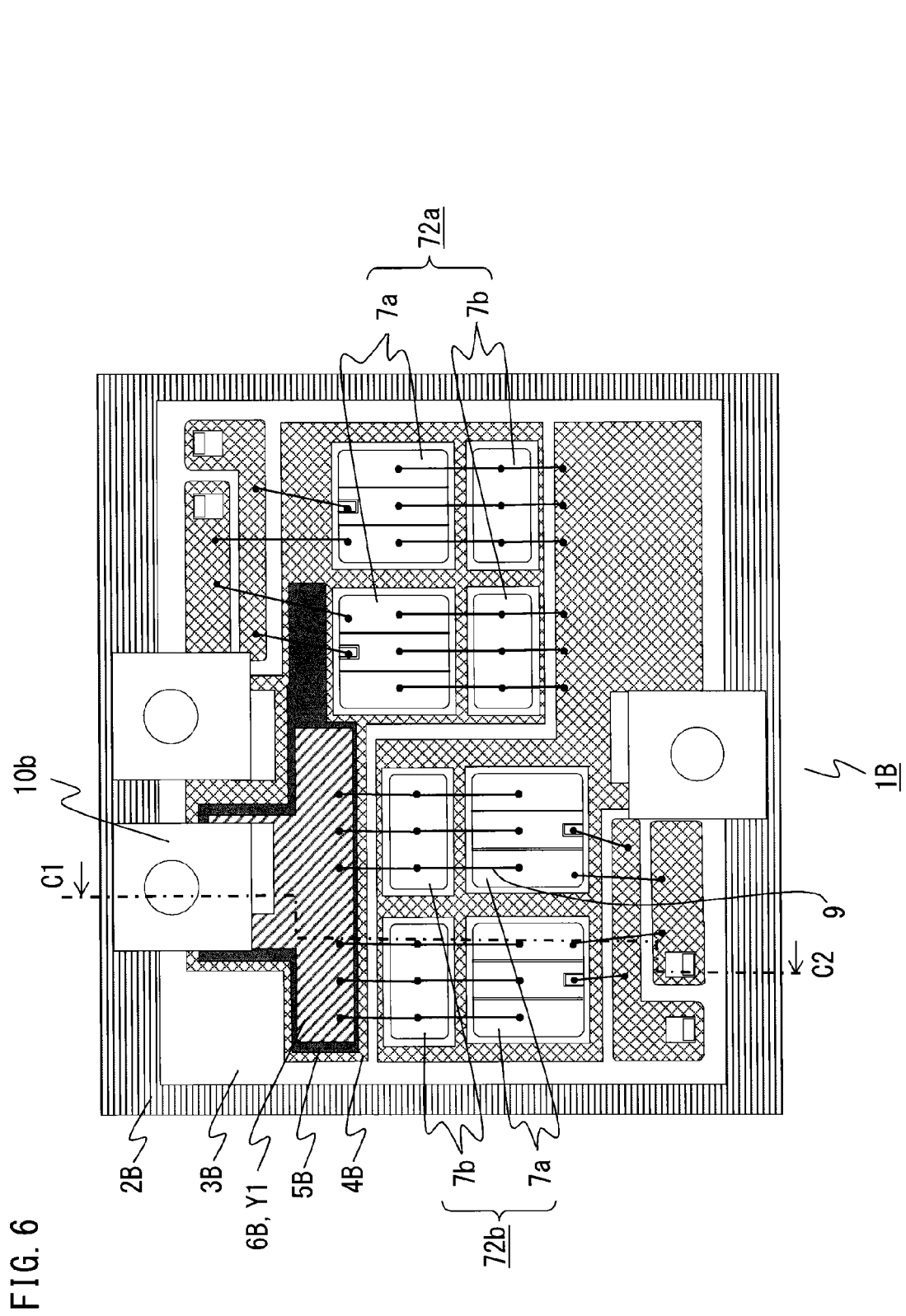
FIG. 6 is a plan view schematically showing the configuration of a power semiconductor module in embodiment 3 of the present invention.
Figure 7:
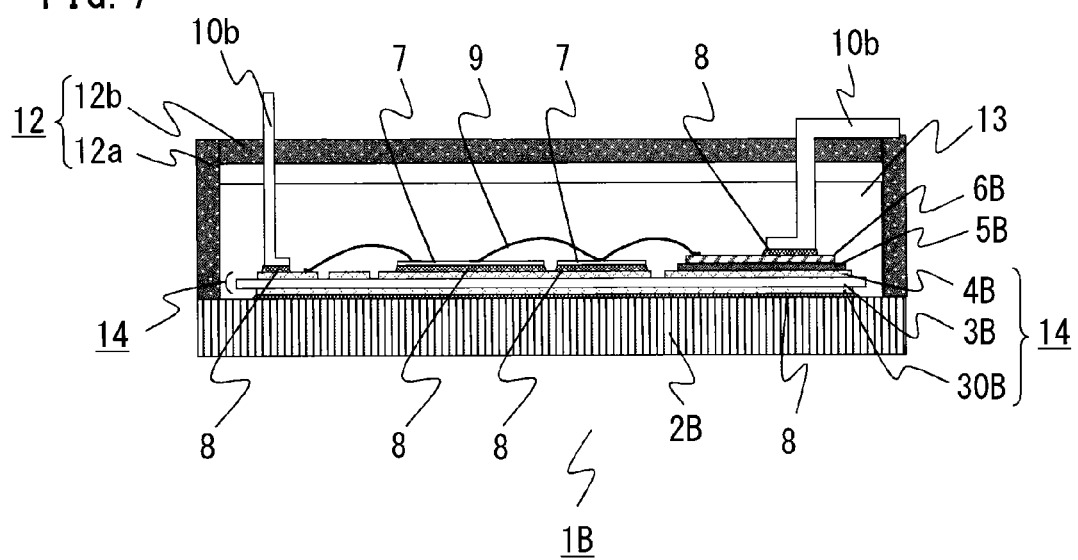
FIG. 7 is a C1-C2 sectional view of the plan view in FIG. 6.

FIG. 6 is a plan view schematically showing the configuration of a power semiconductor module 1B in embodiment 3 of the present invention. FIG. 7 is a C1-C2 sectional view of the plan view in FIG. 6. The present embodiment 3 adopts a power semiconductor module having a so-called 2-in-1 structure, as an example.

The power semiconductor module 1B of the present embodiment 3 is composed of a circuit in which two pairs of the self-arc-extinguishing type semiconductor element 7*a* as the power semiconductor element 7 and the circulation diode 7*b* as the power semiconductor element 7 that are connected in antiparallel are connected in parallel to form one unit, and then two such units are connected in series.

Unlike the above embodiment 1 or embodiment 2, the power semiconductor module 1B of the present embodiment 3 is not a power semiconductor module of transfer-mold type which is sealed with a transfer mold resin. The power semiconductor module 1B of the present embodiment 3 is a power semiconductor module 1B of case type which is more widely used than the transfer-mold type. A power semiconductor module of case type is obtained by injecting a gel sealing resin or the like into a resin case to seal a wiring pattern, a power semiconductor element, and the like, and thereby integrating them.

Generally, in a power semiconductor module of case type, a ceramic insulating layer is used as an insulating layer placed on a base plate which is a metallic heat dissipating body. Also in the present embodiment 3, a first insulating layer 3B made of ceramic is used as the first insulating layer for the first layer placed on the base plate.

First, with reference to FIG. 6 and FIG. 7, the configuration of the power semiconductor module 1B will be described. It is noted that the same components as in the above embodiment 1 are denoted by the same reference characters, and the description thereof is omitted. In addition, for making it easy to grasp the internal configuration of the case of the power semiconductor module 1B, the case is not shown in the plan view in FIG. 6.

In the power semiconductor module 1B, the first insulating layer 3B made of ceramic is provided as the first insulating layer on a base plate 2B which is a metallic heat dissipating body. Actually, a metal foil 30B is connected to the lower surface of the first insulating layer 3B by brazing, and the metal foil 30B is connected to the base plate 2B by solder 8.

Thus, the first insulating layer 3B is adhered on the base plate 2B. On the upper surface of the first insulating layer 3B fixed on the base plate 2B, a first wiring pattern 4B for the first layer, which is formed by etching a metal foil, is adhered by brazing or the like. On a predetermined region that is a part of the first wiring pattern 4B, a second wiring pattern 6B for the second layer, which is formed by a metal foil, is laminated via a second insulating layer 5B. Thus, a pattern laminated region Y1 is formed in which two layers of the wiring patterns 4B and 6B are laminated.

On the first wiring pattern 4B, in a region different from the pattern laminated region Y1, the plurality of power semiconductor elements 7 are mounted and connected to the first wiring pattern 4B by solder 8. In addition, electric connection is made as necessary by wire bonds 9 between the power semiconductor elements 7, between each power semiconductor element 7 and the first and second wiring patterns 4B and 6B, etc. In addition, at any portions on the first and second wiring patterns 4B and 6B, a plurality of terminals 10*b* for external connection are provided. The terminals 10*b* are connected with the first and second wiring patterns 4B and 6B by solder 8. Although the above embodiments 1 and 2 adopt a socket-type terminal as the terminal for external connection, the present embodiment 3 adopts the terminal 10*b* of screw-fastening type as the terminal 10.

These members (the base plate 2B, the first insulating layer 3B, the first wiring pattern 4B, the second insulating layer 5B, the second wiring pattern 6B, the power semiconductor element 7, the wire bond 9, the terminal 10*b*, and the like) are covered with a case 12, and the inside of the case 12 is filled with a sealing resin 13 in a gel state.

Next, a material and the like of each member will be described.

The base plate 2B is the same as in the case of the base plate 2 of the above embodiment 1, so the description thereof is omitted.

As the first insulating layer 3B, a first insulating layer 3B made of ceramic is adopted, unlike the first insulating layer 3 made of resin in the above embodiment 1. Examples of the ceramic include silicon nitride, aluminum nitride, and the like. The thickness of the first insulating layer 3B is set to about 300 to 1000 μm, for example. The second insulating layer 5B is the same as in the above embodiment 1. That is, the second insulating layer 5B is formed by an epoxy resin insulating sheet containing alumina powder as inorganic powder, and the thickness thereof is set to about 20 to 400 μm, for example.

The first wiring pattern 4B, the second wiring pattern 6B, the wire bond 9, and the like are the same as in the above embodiment 1, so the description thereof is omitted.

Here, a general ceramic insulating board often used in a power semiconductor module of case type will be described. The ceramic insulating board is obtained by adhering a metal foil such as a copper foil on one surface of a ceramic insulating layer by brazing, and adhering a wiring pattern formed by, for example, etching a metal foil such as a copper foil, on the other surface by brazing, too.

In the power semiconductor module 1B of the present embodiment 3, the above ceramic insulating board that is generally and commercially available is used as the metal foil 30B, the first insulating layer 3B, and the first wiring pattern 4B. The metal foil 30B, the first insulating layer 3B, and the first wiring pattern 4B correspond to a ceramic insulating board 14.

Next, an example of a manufacturing method for the power semiconductor module 1B will be described.

First, the ceramic insulating board 14 is adhered on the base plate 2B formed by an aluminum plate with a thickness of 3 mm, by solder 8. At this time, the ceramic insulating board 14 is adhered on the base plate 2B such that the metal foil 30B is on the lower side of the ceramic insulating board 14 and the first wiring pattern 4B is on the upper side of the ceramic insulating board 14.

Next, on a predetermined region that is a part of the first wiring pattern 4B for the first layer, an epoxy resin sheet containing alumina powder in a B-stage state is placed as the second insulating layer 5B, and then a copper foil (for second layer) with a thickness of 0.3 mm which has substantially the same size as the second insulating layer 5B is overlaid thereon. Then, by heating and pressurizing them, the first wiring pattern 4B and the copper foil (for second layer) are adhered via the second insulating layer 5B by hardening of the second insulating layer 5B. Thereafter, the copper foil (for second layer) is etched into a predetermined shape, to form a second wiring pattern 6B for the second layer. On the first wiring pattern 4B, element-mounting portions for mounting the power semiconductor elements 7 are provided at predetermined positions. The second insulating layer 5B and the second wiring pattern 6B are formed in a predetermined region other than the element-mounting portions on the first wiring pattern 4B.

Thus, a metallic circuit board is formed by the base plate 2B, the ceramic insulating board 14, the second insulating layer 5B, and the second wiring pattern 6B that are laminated. After the metallic circuit board is formed, a solder resist (not shown) which is an insulating film for protecting the first wiring pattern 4B and the second wiring pattern 6B may be formed at any position on a surface of the metallic circuit board. In addition, before the base plate 2B and the ceramic insulating board 14 are adhered, a solder resist may be formed in advance on the ceramic insulating board 14.

Next, by using solder 8, the power semiconductor elements 7 are bonded with element mounting portions provided at predetermined positions on the first wiring pattern 4B for the first layer, and the terminals 10b for external connection are bonded at any positions on the first wiring pattern 4B and the second wiring pattern 6B. It is noted that the power semiconductor elements 7 are placed only on the first wiring pattern 4B but are not placed on the second wiring pattern 6B.

Here, as described above, the power semiconductor module 1B of the present embodiment 3 is composed of a circuit in which two pairs of the self-arc-extinguishing type semiconductor element 7a and the circulation diode 7b connected in antiparallel are connected in parallel to form one unit, and then two such units are connected in series. Therefore, as also shown in FIG. 6, on the first wiring pattern 4, four pairs of the self-arc-extinguishing type semiconductor element 7a and the circulation diode 7b are provided. In the power semiconductor module 1B of the present embodiment 3, for example, two self-arc-extinguishing type semiconductor elements 7a and two circulation diodes 7b placed at the left half in FIG. 6 form the negative-side arm 70b, and two self-arc-extinguishing type semiconductor elements 7a and two circulation diodes 7b placed at the right half in FIG. 6 form the positive-side arm 70a.

Then, between the first wiring pattern 4B or the second wiring pattern 6B and each power semiconductor element 7, and between the power semiconductor elements 7, connection is made by wire bonds 9 at portions where electric conduction is needed. In the present embodiment 3, connection between the wiring patterns 4B and 6B and each power semiconductor element 7, and connection between the power semiconductor elements 7 are made by wire bonds 9, but are not limited thereto. Any method may be used as long as electric connection can be made.

Next, an outer circumferential portion 12a of the case 12 provided so as to surround the metallic circuit board on which the power semiconductor elements 7, the terminals 10b, and the like are mounted is adhered to the circumference of the upper surface of the base plate 2B by an adhesive agent. Then, the inside thereof is filled with the sealing resin 13 in a gel state, and the sealing resin 13 is hardened by heating. Thereafter, a lid portion 12b for the case 12 is placed, and the outer circumferential portion 12a and the lid portion 12b are adhered by an adhesive agent, thereby forming the case 12.

In the present embodiment 3, an epoxy resin sheet containing alumina powder is used as the second insulating layer 5B. Instead, a film or a sheet of an insulating resin such as polyimide may be used. In addition, besides a process by heating and pressurizing, the first wiring pattern 4B and the second wiring pattern 6B may be bonded by using a polyimide sheet having a gluing agent applied on both surfaces thereof.

As described above, in the present embodiment 3, although the power semiconductor module 1B of case type is adopted unlike the above embodiment 1, the pattern laminated region Y1 is provided in which the second wiring pattern 6B for the second layer is laminated in a partial region on the first wiring pattern 4B for the first layer via only the second insulating layer 5B, as in the above embodiment 1. Therefore, the wiring from the positive terminal to the positive-side arm 70a and the wiring from the negative-side arm 70b to the negative terminal, which form a main circuit of the power semiconductor module 1B, can be provided in a laminated manner in the pattern laminated region Y1, whereby the current path can be formed in a parallel and flat plate shape. Therefore, as in the above embodiment 1, effects such as reduction of the wiring inductance inside the power semiconductor module 1B, efficient reduction of the wiring inductance in the commutation loop, and size reduction of the power semiconductor module 1B can be obtained. In addition, since the power semiconductor elements 7, which are heat sources, are placed on the first wiring pattern 4B for the first layer, heat generated by the power semiconductor elements 7 can be efficiently transferred to the base plate 2B, and thus the power semiconductor module 1B with high cooling performance can be obtained, as in the above embodiment 1.

Regarding the cooling performance, in the present embodiment 3, a ceramic insulating layer is adopted as the first insulating layer 3B between the first wiring pattern 4B on which the power semiconductor elements 7 which are heat sources are mounted, and the base plate 2B. Ceramic such as silicon nitride or aluminum nitride has a small thermal resistance as compared to a resin insulating layer, and therefore can more efficiently transfer heat generated by the power semiconductor elements 7 to the base plate 2B, thereby further improving the cooling performance.

In addition, the configuration of the above embodiment 2 may be applied to the configuration of the present embodiment 3, whereby the wiring for the gate electrode and the wiring for control of the emitter electrode of the self-arc-extinguishing type semiconductor element 7a can be laminated.

The present embodiment 3 has described the circuit in which two pairs of the self-arc-extinguishing type semiconductor element 7a and the circulation diode 7b connected in antiparallel are connected in parallel to form one unit, and then two such units are connected in series. However, in a general 2-in-1 structure, a circuit in which the self-arc-extinguishing type semiconductor element 7a and the circulation diode 7b are connected in antiparallel to form one unit, and then two such units are connected in series, is also often used, and naturally, the present embodiment 3 can be also applied to such a circuit. As a matter of course, the present embodiment 3 can be also applied to a power semiconductor module having a 6-in-1 structure as in the above embodiment 1 or a power semiconductor module having a 1-in-1 structure. In the case of applying the present embodiment 3 to the 6-in-1 structure, since the first and second wiring patterns 4 and 6 are laminated and the wiring inductance can be efficiently reduced, particularly, inductance variation among the phases on the negative side is small. Therefore, when the present invention is applied to the 6-in-1 structure, an effect of reducing switching speed variation or surge voltage variation among the phases can be obtained.

Embodiment 4

Figure 8:
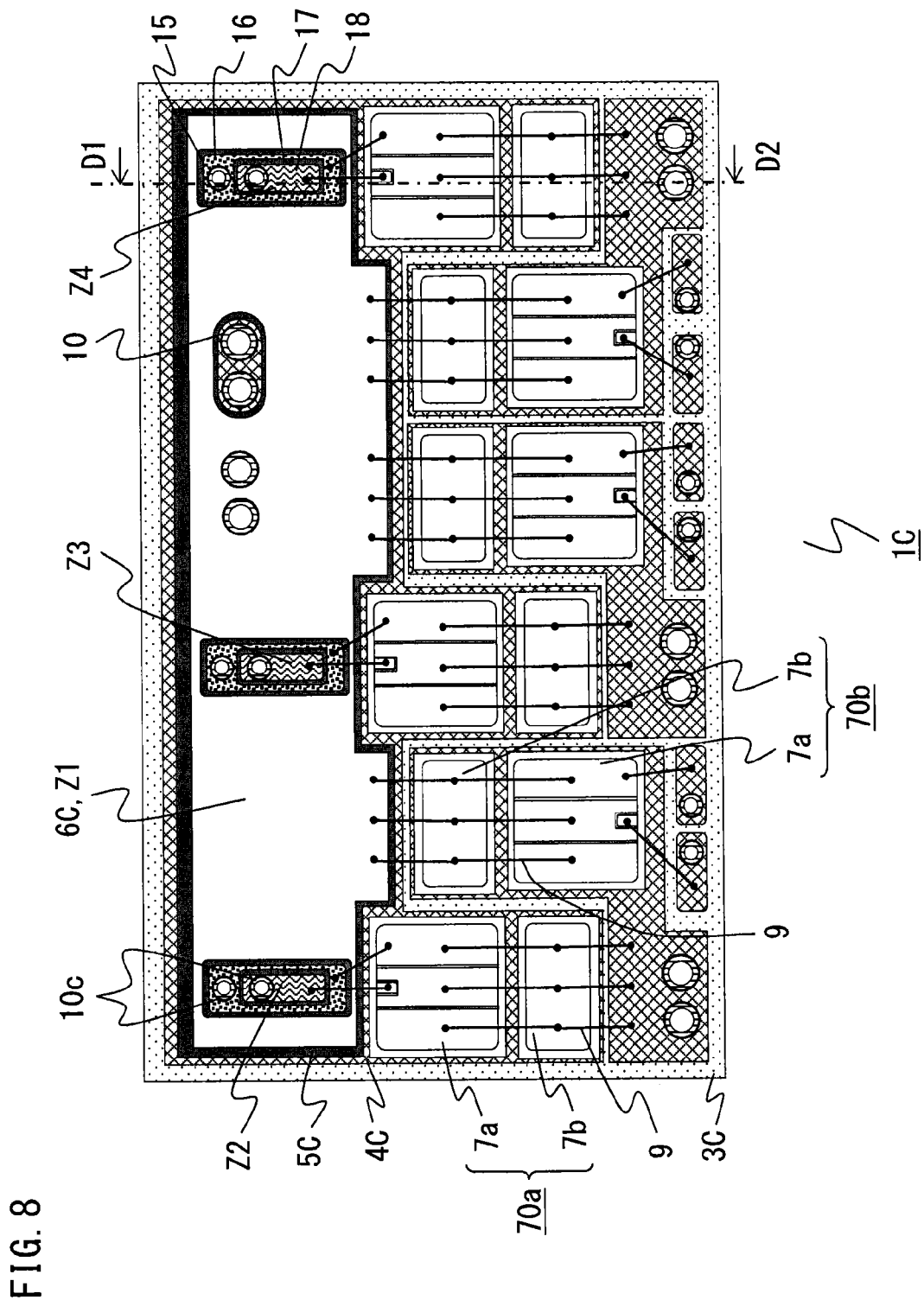
FIG. 8 is a plan view schematically showing the configuration of a power semiconductor module in embodiment 4 of the present invention.
Figure 9:
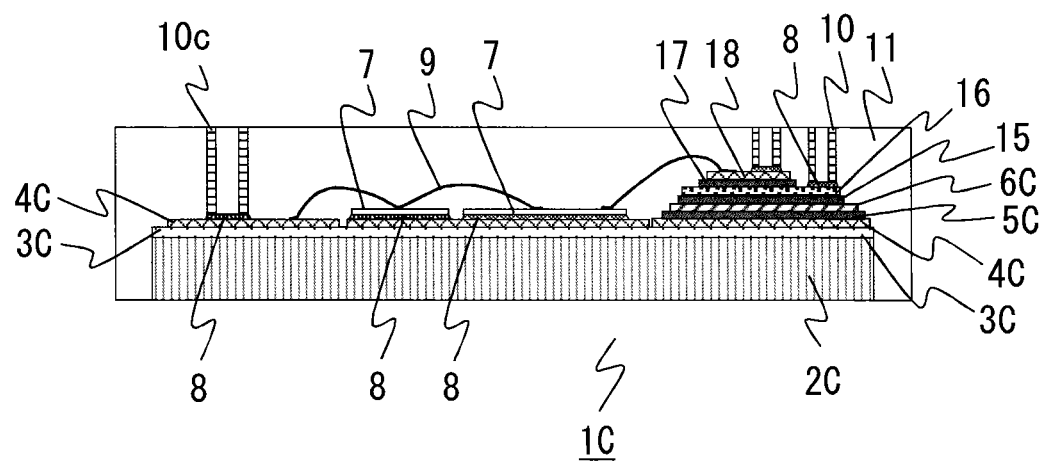
FIG. 9 is a D1-D2 sectional view of the plan view in FIG. 8.

FIG. 8 is a plan view schematically showing the configuration of a power semiconductor module 1C in embodiment 4 of the present invention. FIG. 9 is a D1-D2 sectional view of the plan view in FIG. 8. For making it easy to grasp the internal configuration of the power semiconductor module 1C, a transfer mold resin 11 is not shown in the plan view in FIG. 8.

Also in the present embodiment 4, as in the above embodiments 1 and 2, a power semiconductor module having a 6-in-1 structure is adopted, and the power semiconductor module includes circuits for three phases in each of which two pairs (arms) of the self-arc-extinguishing type semiconductor element 7a and the circulation diode 7b connected in antiparallel are connected in series. A basic configuration such as placement of the power semiconductor elements 7a and 7b is almost the same as in the above embodiments 1 and 2, but the locations where a pattern of wiring for the gate electrode which is a control electrode and a pattern of wiring for control of the emitter electrode which is an output electrode of each self-arc-extinguishing type semiconductor element 7a are provided are different from those in the above embodiments 1 and 2. It is noted that the same components as in the above embodiment 1 are denoted by the same reference characters, and the description thereof is omitted.

As shown in FIG. 8 and FIG. 9, in the power semiconductor module 10 of the present embodiment 4, a base plate 2C, a first insulating layer 3C, a first wiring pattern 4C, a second insulating layer 5C, and a second wiring pattern 6C are laminated in this order, and the configuration thus far is basically the same as that of the power semiconductor module 1 of embodiment 1. Materials and the like of the base plate 2C, the first insulating layer 3C, the first wiring pattern 4C, the second insulating layer 5C, and the second wiring pattern 6C are also the same as those used in the above embodiment 1. In the present embodiment 4, on a pattern laminated region Z1 in which the first wiring pattern 4C for the first layer and the second wiring pattern 6C for the second layer are laminated, a third wiring pattern 16 for the third layer and a fourth wiring pattern 18 for the fourth layer are further laminated.

Specifically, in a partial region on the second wiring pattern 6C in the pattern laminated region Z1, a third insulating layer 15 is provided, and then on the third insulating layer 15, the third wiring pattern 16 for the third layer, which has substantially the same size as the third insulating layer 15, is provided. Further, on a part of the third wiring pattern 16, a fourth insulating layer 17 is provided, and then on the fourth insulating layer 17, the fourth wiring pattern 18 for the fourth layer, which has substantially the same size as the fourth insulating layer 17, is provided. Thus, a four-layer laminated region (Z2 to Z4) in which four layers of wiring patterns are laminated is formed.

In the present embodiment 4, as an example, such four-layer laminated regions are provided at three locations in total (regions indicated by Z2 to Z4 in FIG. 8), and the wirings for the gate electrodes and the wirings for control of the emitter electrodes of the three self-arc-extinguishing type semiconductor elements 7a forming the positive-side arm 70a are formed in the third wiring patterns 16 and the fourth wiring patterns 18 in the four-layer laminated regions Z2 to Z4, respectively. In addition, on each third wiring pattern 16 and each fourth wiring pattern 18, terminals 10c (10) for external connection are provided.

For example, in FIG. 8, for the self-arc-extinguishing type semiconductor element 7a forming the positive-side arm 70a placed at the leftmost, the wiring for control of the emitter electrode is formed in the third wiring pattern 16 for the third layer which includes the four-layer laminated region Z2, and the wiring for the gate electrode is formed in on the fourth wiring pattern 18 for the fourth layer in the four-layer laminated region Z2. Thus, the wiring for the gate electrode and the wiring for control of the emitter electrode of this self-arc-extinguishing type semiconductor element 7a are laminated. The third wiring pattern 16 and the fourth wiring pattern 18 are respectively connected to the emitter electrode and the gate electrode of the self-arc-extinguishing type semiconductor element 7a via wire bonds 9, and the emitter electrode and the gate electrode are connected to the respective terminals 10c (10) for control. External circuits are connected to the terminals 10c (10).

Of the self-arc-extinguishing type semiconductor elements 7a forming the positive-side arms 70a, also for the two self-arc-extinguishing type semiconductor elements 7a other than the self-arc-extinguishing type semiconductor element 7a placed at the leftmost, the wiring for the gate electrode and the wiring for control of the emitter electrode are laminated in each of the four-layer laminated regions Z3 and Z4. In the present embodiment 4, regarding the self-arc-extinguishing type semiconductor element 7a forming the negative-side arm 70b, as in the above embodiment 1, the wiring for the gate electrode and the wiring for control of the emitter electrode are both formed in a predetermined region of the first wiring pattern 4C for the first layer.

It is noted that the third insulating layer 15 and the fourth insulating layer 17 are made of resin. For example, a resin insulating sheet containing inorganic powder or a resin insulating sheet containing a glass fiber may be used. Here, they are formed by an epoxy resin insulating sheet containing alumina powder as inorganic powder, as in the case of the first insulating layer 3C or the second insulating layer 5C. Therefore, adhesion between the second wiring pattern 6C and the third wiring pattern 16, and adhesion between the third wiring pattern 16 and the fourth wiring pattern 18 are performed by the third insulating layer 15 and the fourth insulating layer 17 in a B-stage state being heated and pressurized to be hardened, as described above. The thicknesses of the third insulating layer 15 and the fourth insulating layer 17 are set to about 20 to 400 μm, for example. Besides, a film or a sheet of insulating resin such as polyimide may be used. In addition, besides a process by heating and pressurizing, the wiring patterns 6C, 16, and 18 may be bonded with each other by using a polyimide sheet or the like having a gluing agent applied on both surfaces thereof.

In addition, materials and the like of the third wiring pattern 16 and the fourth wiring pattern 18 are the same as those of the first wiring pattern 4C and the second wiring pattern 6C. For example, the third wiring pattern 16 and the fourth wiring pattern 18 are formed by etching a copper foil with a thickness of 0.3 mm.

As described above, in the present embodiment 4, the third and fourth wiring patterns 16 and 18 for the third layer and the fourth layer are further laminated on the first and second wiring patterns 4 and 6 for the first layer and the second layer, and the wiring for control of the emitter electrode and the wiring for the gate electrode of the self-arc-extinguishing type semiconductor element 7a are respectively formed in the third and fourth wiring patterns, and thus laminated. Therefore, in addition to the effects in the above embodiments 1 and 2, in the power semiconductor module 1C, such a region used only for wiring for control of the emitter electrode and wiring for the gate electrode can be eliminated, whereby the size of the power semiconductor module 1C can be further reduced.

In the present embodiment 4, the wiring for control of the emitter electrode is formed in the third wiring pattern 16 for the third layer, and the wiring for the gate electrode is formed in on the fourth wiring pattern 18 for the fourth layer, but the configuration is not limited thereto. The wiring for the gate electrode may be formed in the third wiring pattern 16 for the third layer, and the wiring for control of the emitter electrode may be formed in the fourth wiring pattern 18 for the fourth layer.

The present embodiment 4 adopts, as an example, the configuration in which only the wiring for the gate electrode and the wiring for control of the emitter electrode of the self-arc-extinguishing type semiconductor element 7a forming the positive-side arm 70a are formed in on the third wiring pattern 16 and the fourth wiring pattern 18 and thus laminated, but the configuration is not limited thereto. For example, only the wiring for the gate electrode and the wiring for control of the emitter electrode of the self-arc-extinguishing type semiconductor element 7a forming the negative-side arm 70b may be formed in a laminated structure, or the wirings for the gate electrodes and the wirings for control of the emitter electrodes of all the self-arc-extinguishing type semiconductor elements 7a may be formed in a laminated structure, as appropriate.

In the power semiconductor modules 1 and 1A to 1C of the above embodiments 1 to 4, a semiconductor material for the power semiconductor element 7 is not particularly limited, and generally, silicon can be used. However, as the power semiconductor element 7, if a wide bandgap semiconductor which uses a wide bandgap semiconductor material such as silicon carbide, gallium-nitride-based material, or diamond is adopted, it becomes possible to reduce loss in the power semiconductor modules 1 and 1A to 1C while keeping the effects of the above embodiments 1 to 4, thereby enabling enhancement in the efficiency of a power conversion device formed by using the power semiconductor modules 1 and 1A to 1C.

In addition, such power semiconductor modules 1 and 1A to 1C have a high withstand voltage and also a high permissible current density, and therefore enable size reduction of the power conversion device. It is noted that a wide bandgap semiconductor may be used for only some of the plurality of power semiconductor elements 7.

Further, since a wide bandgap semiconductor has a high heat resistance, operation at a high temperature can be performed, and also, in the power conversion device, size reduction of a heat dissipation fin of a heat sink and change of a water-cooling portion to an air-cooling type are enabled, whereby the size of the power conversion device can be further reduced.

Although a wide bandgap semiconductor can perform high-speed switching, since surge voltage due to wiring inductance is proportional to the switching speed, there is a limitation to increase in the switching speed. Even in such a case, application of the inventions of the present embodiments 1 to 4 reduces the wiring inductance, thereby enabling high-speed switching.

It is noted that, within the scope of the present invention, the above embodiments may be freely combined with each other, or each of the above embodiments may be modified or abbreviated as appropriate.

The invention claimed is:

1. An insulated power semiconductor module, which contains a plurality of power semiconductor elements therein, the insulated power semiconductor module comprising:
    a base plate as a metallic heat dissipating body;
    a first insulating layer provided on the base plate; and
    a first wiring pattern provided on the first insulating layer, wherein
    a predetermined region on the first wiring pattern is a pattern laminated region in which a second wiring pattern for a second layer is laminated via only a second insulating layer made of resin.

2. The insulated power semiconductor module according to claim 1, wherein the plurality of power semiconductor elements are provided in a region other than the pattern laminated region, on the first wiring pattern.

3. The insulated power semiconductor module according to claim 1, wherein
    the plurality of power semiconductor elements include a self-arc-extinguishing semiconductor element having a gate electrode, an input electrode, and an output electrode, and
    one of wiring for the gate electrode and wiring for control of the output electrode of the self-arc-extinguishing semiconductor element is formed in the first wiring pattern, and the other one is formed in the second wiring pattern, so that the wiring for the gate electrode and the wiring for control of the output electrode are laminated in the pattern laminated region.

4. The insulated power semiconductor module according to claim 1, wherein
    the plurality of power semiconductor elements include a self-arc-extinguishing semiconductor element having a gate electrode, an input electrode, and an output electrode, and
    a third wiring pattern for a third layer is laminated on the second wiring pattern via only a third insulating layer, and a fourth wiring pattern for a fourth layer is laminated on the third wiring pattern via only a fourth insulating layer, and
    one of wiring for the gate electrode and wiring for control of the output electrode of the self-arc-extinguishing semiconductor element is formed in the third wiring pattern, and the other one is formed in the fourth wiring pattern, so that the wiring for the gate electrode and the wiring for control of the output electrode are laminated.

5. The insulated power semiconductor module according to claim 1, wherein
    the first wiring pattern and the second wiring pattern are connected to an input/output electrode and a gate electrode of the power semiconductor element, and the first wiring pattern and the second wiring pattern are insulated.

6. The insulated power semiconductor module according to claim 1, wherein the first insulating layer is made of resin.

7. The insulated power semiconductor module according to claim 1, wherein the first insulating layer is made of ceramic.

8. The insulated power semiconductor module according to claim 1, wherein the plurality of power semiconductor elements include an element formed by a wide bandgap semiconductor.

9. The insulated power semiconductor module according to claim 8, wherein a material of the wide bandgap semiconductor is silicon carbide, gallium nitride, or diamond.

* * * * *